United States Patent
Kiuchi et al.

(10) Patent No.: US 9,431,299 B2
(45) Date of Patent: Aug. 30, 2016

(54) PACKAGE SUBSTRATE DIVIDING METHOD

(71) Applicant: DISCO CORPORATION, Tokyo (JP)

(72) Inventors: Hayato Kiuchi, Tokyo (JP); Shigeya Kurimura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/938,491

(22) Filed: Nov. 11, 2015

(65) Prior Publication Data

US 2016/0148843 A1     May 26, 2016

(30) Foreign Application Priority Data

Nov. 26, 2014    (JP) ................................. 2014-239165

(51) Int. Cl.
| | | |
|---|---|---|
| *H01L 21/78* | (2006.01) | |
| *H01L 21/683* | (2006.01) | |
| *H01L 21/56* | (2006.01) | |

(52) U.S. Cl.
CPC ........... *H01L 21/78* (2013.01); *H01L 21/6836* (2013.01); *H01L 21/561* (2013.01); *H01L 21/568* (2013.01)

(58) Field of Classification Search
CPC combination set(s) only.
See application file for complete search history.

(56) References Cited

U.S. PATENT DOCUMENTS

| | | | | |
|---|---|---|---|---|
| 2009/0203193 A1* | 8/2009 | Morikazu | .......... | B23K 26/0853 438/463 |
| 2010/0055877 A1* | 3/2010 | Kajiyama | ........... | H01L 21/6835 438/464 |

FOREIGN PATENT DOCUMENTS

| | | |
|---|---|---|
| JP | 2000-208445 | 7/2000 |
| JP | 2000-232080 | 8/2000 |

* cited by examiner

*Primary Examiner* — Mohammad Islam
*Assistant Examiner* — Ratisha Mehta
(74) *Attorney, Agent, or Firm* — Greer Burns & Crain Ltd.

(57) ABSTRACT

A package substrate is divided into a plurality of device packages. An adhesive tape is attached to a back side of the substrate by cutting the substrate along a plurality of division lines formed on a front side of the substrate. The substrate includes a device portion partitioned into a plurality of device package regions by the division lines, and a marginal portion surrounding the device portion. A first ultraviolet light is applied to reduce the adhesive force of the adhesive tape in the marginal portion. The adhesive tape is partially peeled from the substrate in the marginal portion, and the substrate is cut along each division line by using a cutting blade to thereby divide the substrate into the device packages. In the dividing step, the marginal portion separated from the substrate is scattered by rotation of the cutting blade and thereby removed from the adhesive tape.

2 Claims, 5 Drawing Sheets

PACKAGE SUBSTRATE DIVIDING METHOD

BACKGROUND OF THE INVENTION

1. Field of the Invention

The present invention relates to a dividing method for a package substrate having a plurality of devices sealed with resin or the like.

2. Description of the Related Art

In a semiconductor packaging technique such as chip size package (CSP) and quad flat non-leaded package (QFN), a package substrate having a plurality of devices (device chips) sealed with resin or the like is used. The package substrate is composed of a plurality of device portions each including a plurality of devices and a marginal portion surrounding each device portion. Each device portion is partitioned into a plurality of device package regions individually corresponding to the plural devices by a plurality of division lines formed on the front side of the package substrate. The package substrate is divided along these division lines to thereby obtain a plurality of device packages each corresponding to the plural devices (device chips).

In dividing the package substrate by cutting or the like, an adhesive tape is attached to the back side of the package substrate, so as to prevent scattering of the device packages formed by the division of the package substrate (see Japanese Patent Laid-Open No. 2000-208445, for example). However, in the case that the adhesive tape is simply attached to the package substrate, various mechanisms for holding the package substrate must be designed so as to be dedicated to the package substrate. To cope with this problem, an annular frame is generally fixed to the peripheral portion of the adhesive tape attached to the back side of the package substrate (see Japanese Patent Laid-Open No. 2000-232080, for example). By fixing the annular frame to the adhesive tape, different kinds of package substrates can be suitably divided without changing the configuration of a cutting apparatus.

SUMMARY OF THE INVENTION

After dividing the package substrate into the plural device packages, the device packages are picked up (peeled) from the adhesive tape. In picking up the plural device packages, there is a possibility that the marginal portion left on the adhesive tape may be erroneously picked up to cause the hindrance to the operation. Particularly in the case of peeling the plural device packages at a time, the hindrance to the operation is remarkable. To cope with this problem, the marginal portion is preliminarily picked up and thereby removed from the adhesive tape before picking up the device packages.

However, when the package substrate is divided along each division line, the marginal portion is also divided into small pieces. As a result, much time is required for the pickup of the marginal portion, causing a reduction in productivity of the device packages. This problem is especially serious in a package substrate such that the size of each device package is small and the number of division lines is therefore large.

It is therefore an object of the present invention to provide a package substrate dividing method which can maintain the productivity of the device packages at a high level.

In accordance with an aspect of the present invention, there is provided a package substrate dividing method for dividing a package substrate into a plurality of device packages in a condition where an ultraviolet curing type adhesive tape is attached to a back side of the package substrate, by holding the package substrate through the adhesive tape on a chuck table and cutting the package substrate along a plurality of division lines formed on a front side of the package substrate, the package substrate including a device portion partitioned into a plurality of device package regions by the division lines and a marginal portion surrounding the device portion. The package substrate dividing method includes a first ultraviolet light applying step of applying ultraviolet light to the adhesive tape in a condition where a first area of the adhesive tape corresponding to the marginal portion is exposed and a second area of the adhesive tape corresponding to the device portion is masked by a mask member, thereby reducing an adhesive force of the adhesive tape in the first area corresponding to the marginal portion; a partial peeling step of partially peeling the adhesive tape from the package substrate in the first area corresponding to the marginal portion after performing the first ultraviolet light applying step; and a dividing step of cutting the package substrate along each division line by using a cutting blade set at a height where the adhesive tape attached to the back side of the package substrate is cut by the cutting blade, thereby dividing the package substrate into the device packages after performing the partial peeling step; wherein in the dividing step, the marginal portion separated from the package substrate is scattered by a rotation of the cutting blade and thereby removed from the adhesive tape.

Preferably, the package substrate dividing method further includes a second ultraviolet light applying step of applying ultraviolet light to the adhesive tape in the second area corresponding to the device portion to thereby reduce an adhesive force of the adhesive tape in the second area corresponding to the device portion after performing the dividing step; and a device peeling step of peeling the device packages from the adhesive tape after performing the second ultraviolet light applying step.

In the package substrate dividing method according to the present invention, the partial peeling step of partially peeling the adhesive tape from the package substrate in the first area corresponding to the marginal portion is performed before performing the dividing step of dividing the package substrate. Accordingly, in the dividing step, the marginal portion separated from the package substrate can be scattered by the rotation of the cutting blade and thereby removed from the adhesive tape. In other words, it is unnecessary to pick up the marginal portion, so that the productivity of the device packages can be maintained at a high level.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The package substrate dividing method according to the preferred embodiment includes a first ultraviolet light applying step, a partial peeling step, a dividing step, a second ultraviolet light applying step, and a device peeling step. In the first ultraviolet light applying step, ultraviolet light is applied to an adhesive tape in its first area corresponding to the marginal portion of a package substrate, thereby reducing the adhesive force of the adhesive tape in this first area. In the partial peeling step, the adhesive tape is partially peeled from the package substrate in the first area corresponding to the marginal portion. In the dividing step, the package substrate is cut along each division line as removing the marginal portion, thereby dividing the package substrate into a plurality of device packages. In the second ultraviolet light applying step, ultraviolet light is applied to the adhesive tape in its second area corresponding to the device portion of the package substrate, thereby reducing the adhesive force of the adhesive tape in this second area. In the device peeling step, the plural device packages are peeled from the adhesive tape. The package substrate dividing method according to the preferred embodiment will now be described in more detail.

Figure 1A:
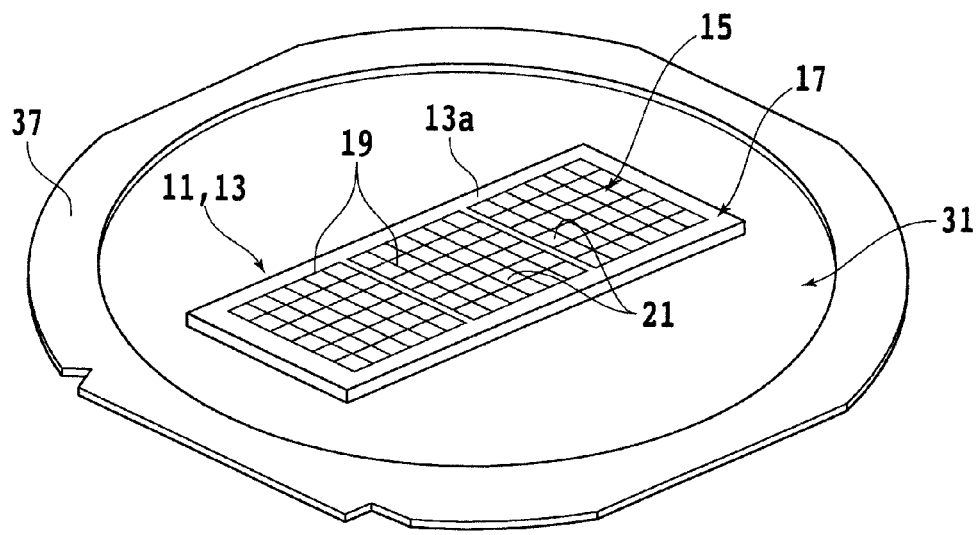
FIG. 1A is a schematic perspective view of a package substrate to be divided by a package substrate dividing method according to a preferred embodiment of the present invention.
Figure 1B:
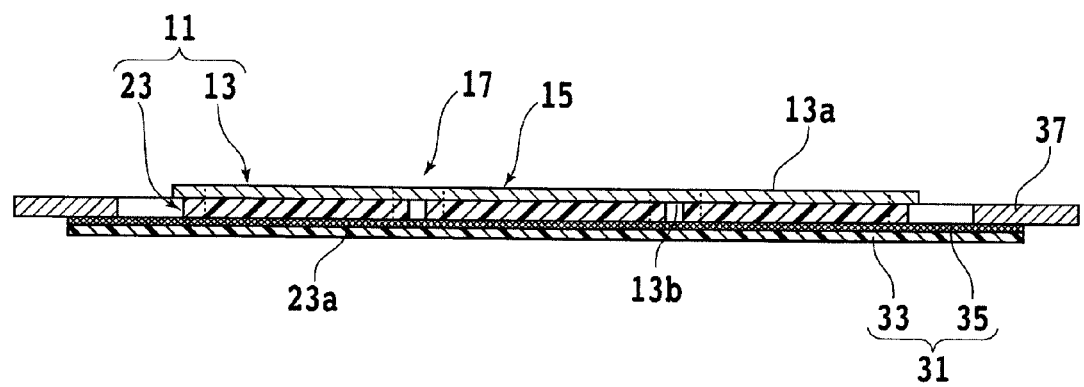
FIG. 1B is a schematic sectional view of the package substrate shown in FIG. 1A.

FIG. 1A is a schematic perspective view of a package substrate to be divided by the package substrate dividing method according to the preferred embodiment, and FIG. 1B is a schematic sectional view of the package substrate shown in FIG. 1A. As shown in FIGS. 1A and 1B, a package substrate 11 includes a base 13 having a substantially rectangular shape as viewed in plan. The base 13 is formed of a metal material such as 42 alloy (alloy of iron and nickel) and copper. The base 13 has a front side 13a and a back side 13b. The front side 13a of the base 13 is composed of a plurality of (e.g., three in the preferred embodiment) device portions 15 and a marginal portion 17 surrounding each device portion 15.

As shown in FIG. 1A, each device portion 15 is partitioned into a plurality of (e.g., 36 in the preferred embodiment) device package regions 21 by a plurality of crossing division lines (streets) 19. A device (device chip) (not shown) such as IC and LED is provided on the back side 13b of the base 13 at a position corresponding to each device package region 21. That is, the plural device package regions 21 on the front side 13a of the base 13 are respectively correspond to the plural devices (device chips) on the back side 13b of the base 13. These plural devices (device chips) are sealed by a sealing portion 23 (see FIG. 1B) formed on the back side 13b of the base 13 in an area corresponding to each device portion 15.

As shown in FIG. 1B, each sealing portion 23 is formed of resin or the like and has a predetermined thickness so as to project from the back side 13b of the base 13. Each sealing portion 23 has a front side 23a. In the preferred embodiment, the front side 23a of each sealing portion 23 is referred to as the back side of the package substrate 11, and the front side 13a of the base 13 is referred to as the front side of the package substrate 11. An adhesive tape 31 is attached to the front side 23a of each sealing portion 23 corresponding to the back side of the package substrate 11. The adhesive tape 31 has a substantially circular shape and a size larger than the package substrate 11. As shown in FIG. 1B, the adhesive tape 31 is composed of a base layer 33 like a film of resin or the like and an adhesive layer 35 formed on one side (upper surface) of the base layer 33. The adhesive tape 31 can be attached to the package substrate 11 by bringing the adhesive layer 35 into close contact with the back side of the package substrate 11 (i.e., the front side 23a of each sealing portion 23).

The adhesive layer 35 contains an ultraviolet curing resin. Accordingly, when ultraviolet light is applied to the adhesive layer 35, the adhesive force of the adhesive layer 35 to the package substrate 11 can be reduced because of curing of the resin. An annular frame 37 is fixed to the peripheral portion of the adhesive tape 31 by the adhesive force of the adhesive layer 35. In other words, the package substrate 11 is supported through the adhesive tape 31 to the annular frame 37.

Figure 2A:
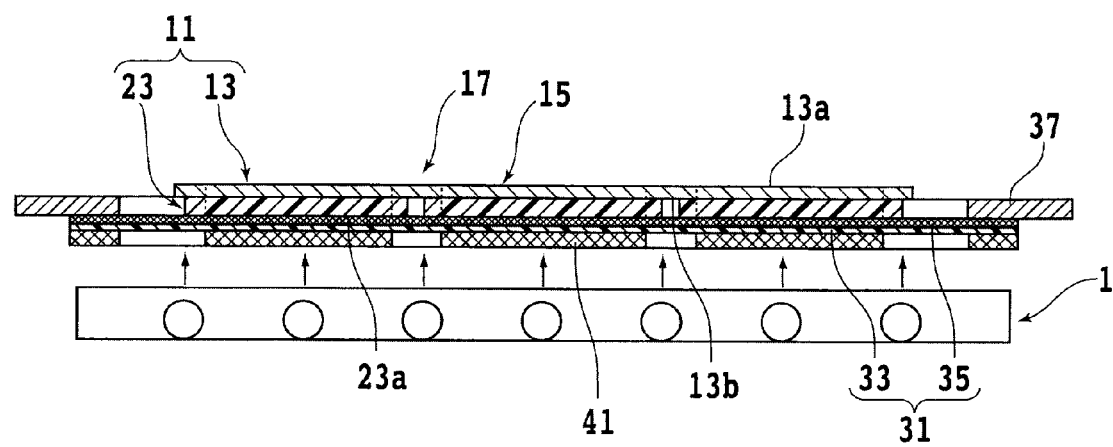
FIG. 2A is a partially sectional side view for illustrating a first ultraviolet light applying step.

In the package substrate dividing method according to the preferred embodiment, the first ultraviolet light applying step is performed in such a manner that ultraviolet light is applied to the adhesive tape 31 in its first area corresponding to the marginal portion 17 of the package substrate 11, thereby reducing the adhesive force of the adhesive tape 31 in this first area. FIG. 2A is a partially sectional side view for illustrating the first ultraviolet light applying step. As shown in FIG. 2A, a mask member 41 for limiting an ultraviolet light applying area is first provided on the lower surface of the adhesive tape 31 (the surface opposite to the adhesive layer 35) in the first ultraviolet light applying step. The mask member 41 has a light blocking portion corresponding to each device portion 15. Accordingly, the second area of the adhesive tape 31 corresponding to each device portion 15 is covered with the light blocking portion of the mask member 41, and the first area of the adhesive tape 31 corresponding to the marginal portion 17 is exposed. Thereafter, a light source 1 is located below the adhesive tape 31 and ultraviolet light is emitted from the light source 1. As described above, the second area of the adhesive tape 31 corresponding to each device portion 15 is covered with the light blocking portion of the mask member 41, so that the ultraviolet light emitted from the light source 1 is applied to only the first area of the adhesive tape 31 corresponding to the marginal portion 17. As a result, the adhesive force of the adhesive tape 31 in only the first area corresponding to the marginal portion 17 can be reduced.

Figure 2B:
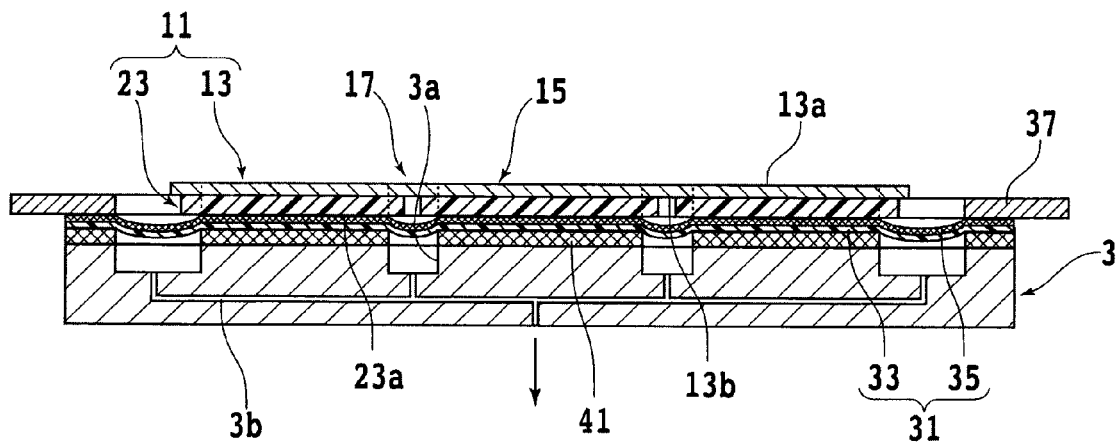
FIG. 2B is a schematic sectional view for illustrating a partial peeling step.

After performing the first ultraviolet light applying step, the partial peeling step is performed in such a manner that the adhesive tape 31 is partially peeled from the package substrate 11 in the first area corresponding to the marginal portion 17. FIG. 2B is a schematic sectional view for illustrating the partial peeling step. In the partial peeling step shown in FIG. 2B, a suction unit 3 is used to partially peel the adhesive tape 31. The suction unit 3 is formed like a table capable of mounting the package substrate 11 through the adhesive tape 31. That is, the suction unit 3 has a mounting surface for mounting the package substrate 11 thereon. The mounting surface of the suction unit 3 is formed with a suction groove 3a corresponding to the marginal portion 17 of the package substrate 11. The suction groove 3a is connected to a vacuum source (not shown) through a suction passage 3b formed in the suction unit 3. Accordingly, when the package substrate 11 is mounted through the adhesive tape 31 on the mounting surface of the suction unit 3 and a vacuum produced in the vacuum source is applied to the suction groove 3a, the first area of the adhesive tape 31 corresponding to the marginal portion 17 can be peeled from the package substrate 11.

As described above, the adhesive force of the adhesive tape 31 in the first area corresponding to the marginal portion 17 is reduced in the first ultraviolet light applying step before the partial peeling step. Accordingly, the first area of the adhesive tape 31 corresponding to the marginal portion 17 can be easily peeled from the package substrate 11 by the above method in the partial peeling step. Further, in the condition where only the first area of the adhesive tape 31 corresponding to the marginal portion 17 is peeled from the package substrate 11 in the partial peeling step, the second area of the adhesive tape 31 corresponding to each device portion 15 is kept attached to each device portion 15. That is, the package substrate 11 is kept attached to the adhesive tape 31. After partially peeling the adhesive tape 31, the mask member 41 is preferably removed.

Figure 3:
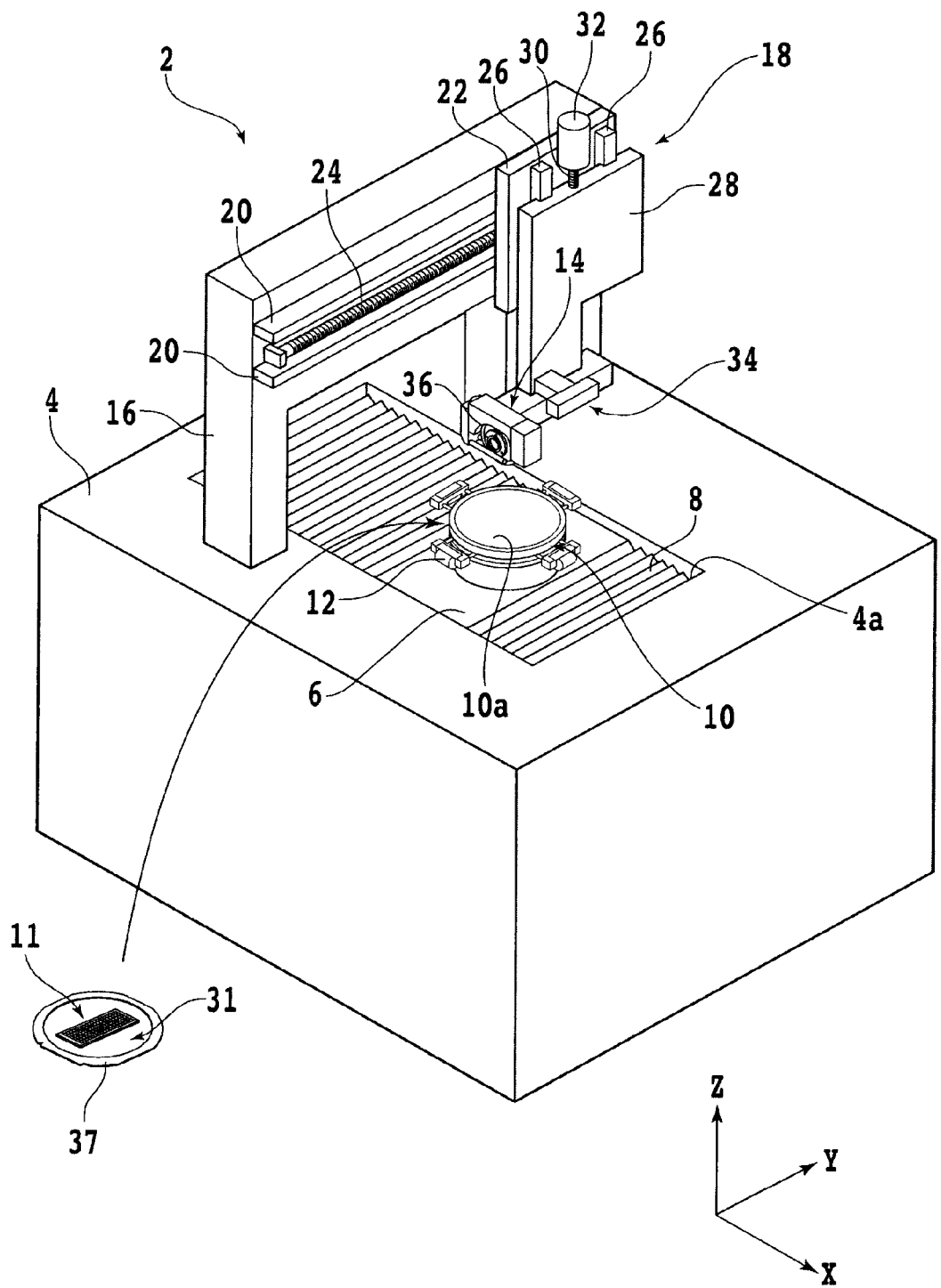
FIG. 3 is a schematic perspective view of a cutting apparatus for use in performing a dividing step.

After performing the partial peeling step, the dividing step is performed in such a manner that the package substrate 11 is cut along each division line 19 as removing the marginal portion 17, thereby dividing the package substrate 11 into a plurality of device packages. FIG. 3 is a schematic perspective view of a cutting apparatus for use in performing the dividing step. As shown in FIG. 3, a cutting apparatus 2 includes a base 4 for supporting various structures. The base 4 has an upper surface, which is formed with a rectangular opening 4a elongated in the X direction (longitudinal direction, or feeding direction). There are provided in the opening 4a an X table 6, an X moving mechanism (feeding means) (not shown) for moving the X table 6 in the X direction, and a drip-proof dust cover 8 for covering the X moving mechanism.

The X moving mechanism includes a pair of parallel X guide rails (not shown) extending in the X direction, and the X table 6 is slidably mounted on the X guide rails. A nut portion (not shown) is provided on the lower surface of the X table 6, and an X ball screw (not shown) extending parallel to the X guide rails is threadedly engaged with this nut portion of the X table 6. An X pulse motor (not shown) is connected to one end of the X ball screw. Accordingly, when the X pulse motor is operated to rotate the X ball screw, the X table 6 is moved along the X guide rails in the X direction.

A chuck table 10 for holding the package substrate 11 under suction is provided on the X table 6. Four clamps 12 for clamping the annular frame 37 at its four positions are provided on the outer circumference of the chuck table 10. The chuck table 10 is connected to a rotational drive source (not shown) such as a motor, so that the chuck table 10 is rotatable by this rotational drive source so as to rotate about an axis extending in the Z direction (vertical direction). The chuck table 10 is also movable in the X direction by the X moving mechanism, that is, the chuck table 10 is adapted to be fed in the X direction by the X moving mechanism. The chuck table 10 has an upper surface as a holding surface 10a for holding the package substrate 11 under suction. The holding surface 10a of the chuck table 10 is connected to a vacuum source (not shown) through a suction passage (not shown) formed in the chuck table 10.

A double column type support structure 16 for supporting a cutting unit (cutting means) 14 is provided on the upper surface of the base 4 so as to straddle the opening 4a. The cutting unit 14 functions to cut the package substrate 11. A cutting unit moving mechanism (indexing means) 18 for moving the cutting unit 14 in the Y direction (indexing direction) and the Z direction (vertical direction) is provided on the front side of the support structure 16 at an upper portion thereof.

The cutting unit moving mechanism 18 includes a pair of parallel Y guide rails 20 extending in the Y direction. The Y guide rails 20 are provided on the front surface of the support structure 16. A Y plate 22 constituting the cutting unit moving mechanism 18 is slidably mounted on the Y guide rails 20. A nut portion (not shown) is provided on the back side (rear surface) of the Y plate 22, and a Y ball screw 24 extending parallel to the Y guide rails 20 is threadedly engaged with this nut portion of the Y plate 22. A Y pulse motor (not shown) is connected to one end of the Y ball screw 24. Accordingly, when the Y pulse motor is operated to rotate the Y ball screw 24, the Y plate 22 is moved along the Y guide rails 20 in the Y direction.

A pair of parallel Z guide rails 26 extending in the Z direction are provided on the front side (front surface) of the Y plate 22. A Z plate 28 is slidably mounted on the Z guide rails 26. A nut portion (not shown) is provided on the back side (rear surface) of the Z plate 28, and a Z ball screw 30 extending parallel to the Z guide rails 26 is threadedly engaged with this nut portion of the Z plate 28. A Z pulse motor 32 is connected to one end of the Z ball screw 30. Accordingly, when the Z pulse motor 32 is operated to rotate the Z ball screw 30, the Z plate 28 is moved along the Z guide rails 26 in the Z direction.

The cutting unit 14 for cutting the package substrate 11 is provided on the Z plate 28 at a lower portion thereof. A camera 34 for imaging the front side of the package substrate 11 is also provided on the Z plate 28 at a position adjacent to the cutting unit 14. When the cutting unit moving mechanism 18 is operated to move the Y plate 22 in the Y direction, the cutting unit 14 and the camera 34 are indexed in the Y direction. Further, when the cutting unit moving mechanism 18 is operated to move the Z plate 28 in the Z direction, the cutting unit 14 and the camera 34 are vertically moved. The cutting unit 14 includes a spindle (not shown) having a rotation axis extending in the Y direction and an annular cutting blade 36 mounted on one end of the spindle. A rotational drive source (not shown) such as a motor is connected to the other end of the spindle, so that the cutting blade 36 mounted on the spindle is rotated by this rotational drive source.

Figure 4A:
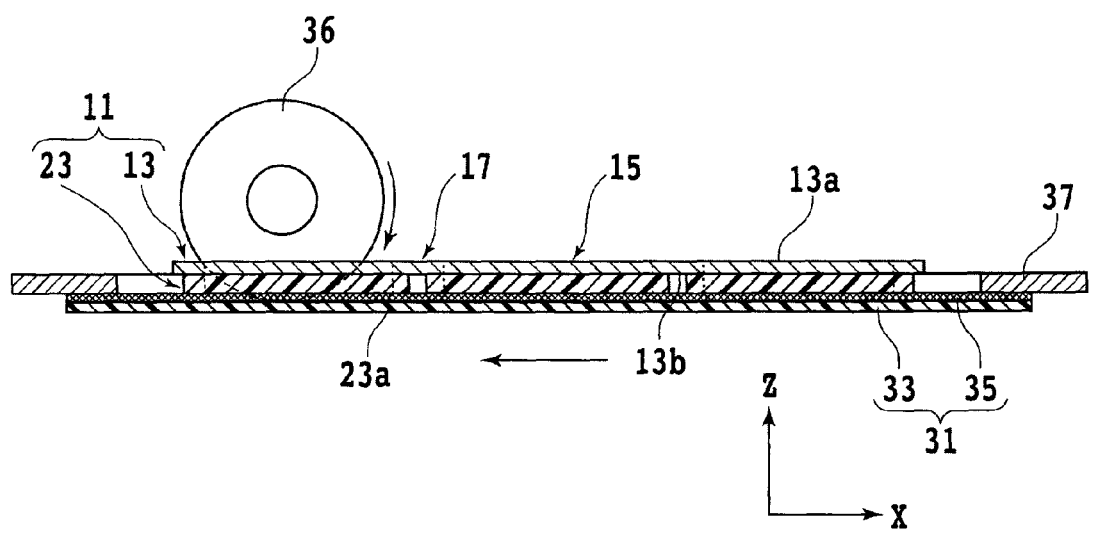
FIG. 4A is a partially sectional side view for illustrating the dividing step.
Figure 4B:
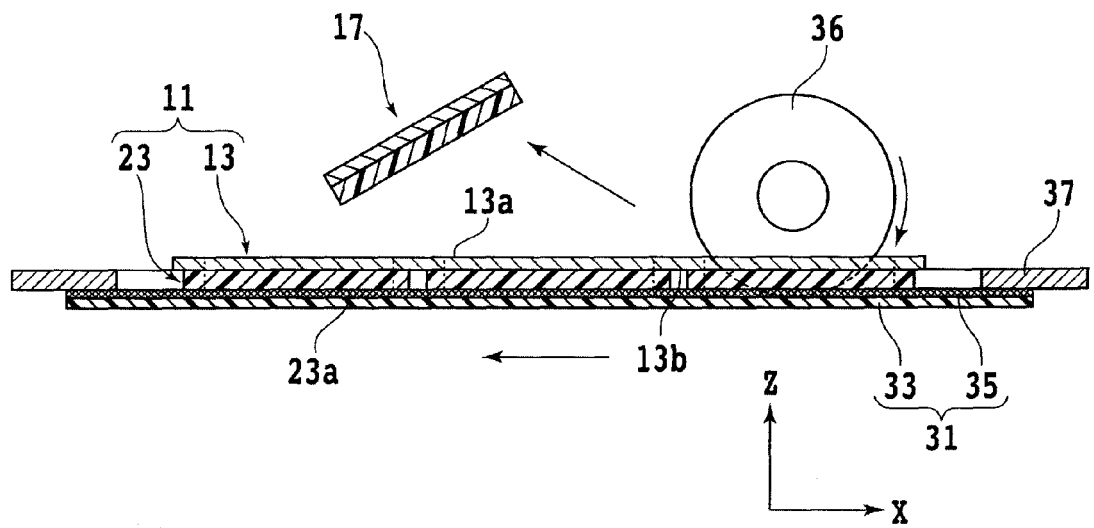
FIG. 4B is a partially sectional side view for illustrating a condition that a marginal portion is scattered in the dividing step.

FIG. 4A is a partially sectional side view for illustrating the dividing step, and FIG. 4B is a partially sectional side view for illustrating a condition that the marginal portion 17 is scattered in the dividing step. In the dividing step, the package substrate 11 is first placed on the chuck table 10 in the condition where the front side of the package substrate 11 is exposed upward. Further, the annular frame 37 is fixed by the clamps 12. Thereafter, a vacuum produced in the vacuum source is applied to the holding surface 10a of the chuck table 10, thereby holding the package substrate 11 on the chuck table 10 under suction. Thereafter, the chuck table 10 and the cutting unit 14 are relatively moved and the chuck table 10 is rotated to make a target one of the division lines 19 parallel to the X direction and position the cutting blade 36 in line with the target division line 19. Further, the cutting blade 36 is also rotated and lowered until the lower end of the cutting blade 36 reaches a position lower than the back side of the package substrate 11 (i.e., the front side 23a of each sealing portion 23). Thereafter, the chuck table 10 is moved (fed) in the X direction. In this manner, the cutting blade 36 is set at the height where the adhesive tape 31 attached to the back side of the package substrate 11 is cut by the cutting blade 36, and the package substrate 11 and the cutting blade 36 are next relatively moved, so that the package substrate 11 can be cut along the target division line 19 as shown in FIG. 4A. Similarly, the package substrate 11 can be cut along all of the other division lines 19.

In the partial peeling step before the dividing step, the adhesive tape 31 is partially peeled from the package substrate 11 in the first area corresponding to the marginal portion 17 of the package substrate 11. Accordingly, the marginal portion 17 separated from the package substrate 11 in the dividing step is scattered by the rotation of the cutting blade 36 as shown in FIG. 4B. On the other hand, the adhesive force of the adhesive tape 31 in the second area corresponding to each device portion 15 of the package substrate 11 is maintained, so that each device portion 15 is not scattered. In this manner, only the marginal portion 17 is removed from the adhesive tape 31 in the dividing step, so that it is unnecessary to pick up the marginal portion 17 in a subsequent step.

The adhesive force of the adhesive tape 31 in the first area corresponding to the marginal portion 17 is greatly reduced by peeling this first area from the package substrate 11 in the partial peeling step. Accordingly, even when the adhesive tape 31 comes into close contact again with the package substrate 11 after the partial peeling step, there is no problem in removing the marginal portion 17 in the dividing step. Unless the partial peeling step is performed before the dividing step, the adhesive force of the adhesive tape 31 in the first area corresponding to the marginal portion 17 cannot be sufficiently reduced to cause a problem that the marginal portion 17 cannot be properly removed. In the case that only the first ultraviolet light applying step is performed before the dividing step, the adhesive force of the adhesive tape 31 in the first area corresponding to the marginal portion 17 cannot be sufficiently reduced to cause the problem that the marginal portion 17 cannot be properly removed.

After the package substrate 11 is cut along all of the division lines 19 to obtain a plurality of device packages 25 (see FIG. 5A), this dividing step is finished.

Figure 5A:
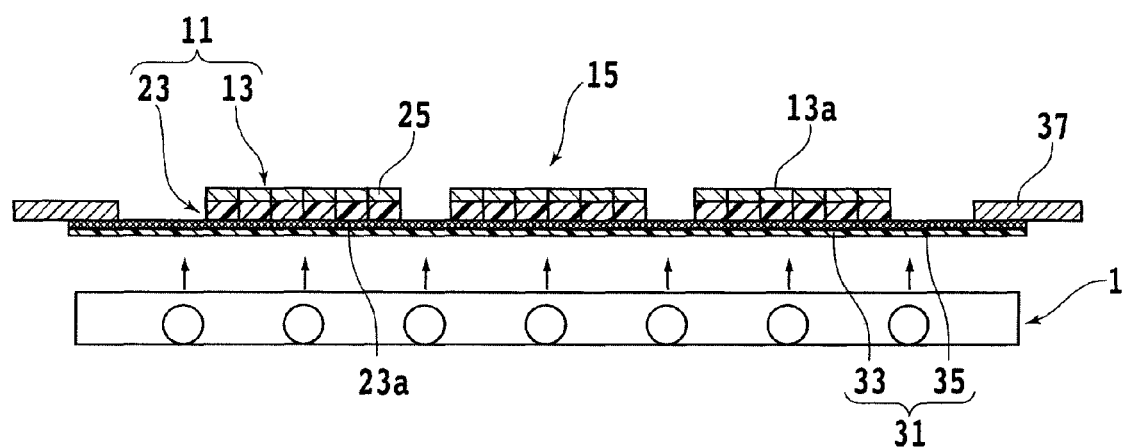
FIG. 5A is a partially sectional side view for illustrating a second ultraviolet light applying step.

After performing the dividing step, the second ultraviolet light applying step is performed in such a manner that ultraviolet light is applied to the adhesive tape 31 in its second area corresponding to each device portion 15 of the package substrate 11, thereby reducing the adhesive force of the adhesive tape 31 in this second area. FIG. 5A is a partially sectional side view for illustrating the second ultraviolet light applying step. As shown in FIG. 5A, the light source 1 is located below the adhesive tape 31 and ultraviolet light is emitted from the light source 1 in the second ultraviolet light applying step. Accordingly, the ultraviolet light emitted from the light source 1 is applied to the second area of the adhesive tape 31 corresponding to each device portion 15. As a result, the adhesive force of the adhesive tape 31 in this second area can be reduced.

Figure 5B:
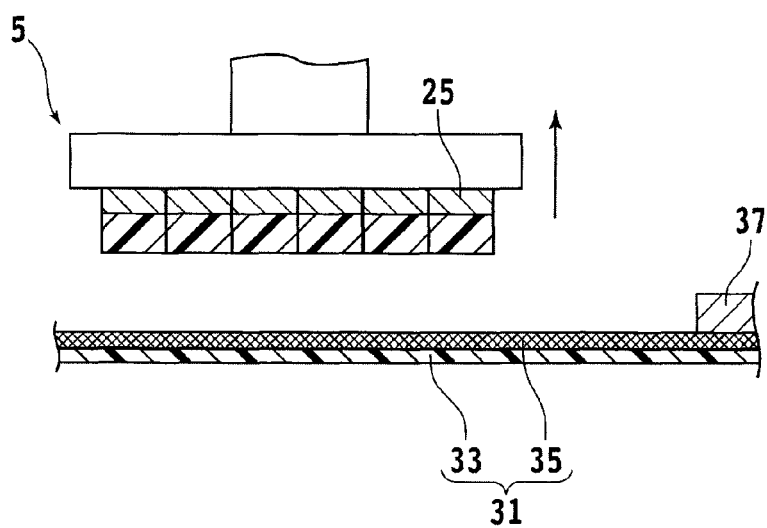
FIG. 5B is a partially sectional side view for illustrating a device peeling step.

After performing the second ultraviolet light applying step, the device peeling step is performed in such a manner that the plural device packages 25 are peeled from the adhesive tape 31. FIG. 5B is a partially sectional side view for illustrating the device peeling step. As shown in FIG. 5B, a pickup apparatus 5 is used to hold the plural device packages 25 under suction and then peel them from the adhesive tape 31 in the device peeling step. In the second ultraviolet light applying step before the device peeling step, the adhesive force of the adhesive tape 31 in the second area corresponding to each device portion 15 is reduced. Accordingly, the device packages 25 can be easily picked up (peeled) from the adhesive tape 31. Further, in the dividing step before the second ultraviolet light applying step, the marginal portion 17 is removed from the adhesive tape 31, so that there is no possibility that the marginal portion 17 may be erroneously picked up in picking up the plural device packages 25 in the device peeling step. The device packages 25 thus picked up are next stored into an arbitrary case (not shown) or the like.

As described above, in the package substrate dividing method according to the preferred embodiment, the partial peeling step of partially peeling the adhesive tape 31 from the package substrate 11 in the first area corresponding to the marginal portion 17 is performed before performing the dividing step of dividing the package substrate 11. Accordingly, in the dividing step, the marginal portion 17 separated from the package substrate 11 can be scattered by the rotation of the cutting blade 36 and thereby removed from the adhesive tape 31. In other words, it is unnecessary to pick up the marginal portion 17, so that the productivity of the device packages 25 can be maintained at a high level.

The present invention is not limited to the above embodiment, but various modifications may be made. For example, while the mask member 41 is removed after partially peeling the adhesive tape 31 in the above preferred embodiment, the mask member 41 may be removed at any time after the first ultraviolet light applying step and before the second ultraviolet light applying step.

Further, while the annular frame 37 is fixed to the peripheral portion of the adhesive tape 31 in the above preferred embodiment, the annular frame 37 may be omitted. In this case, an adhesive tape having substantially the same size as that of the package substrate 11 is attached to the package substrate 11. Also in this case, the adhesive force of the adhesive tape in its first area corresponding to the marginal portion 17 of the package substrate 11 is reduced in the first ultraviolet light applying step, and the adhesive tape is next partially peeled from the package substrate 11 in the first area corresponding to the marginal portion 17 in the partial peeling step. In the dividing step, the package substrate 11 is held through the adhesive tape on a chuck table (not shown) corresponding to the package substrate 11 under suction and then cut along each division line 19 by a cutting blade. Accordingly, the marginal portion 17 separated from the package substrate 11 can be scattered by the rotation of the cutting blade and thereby removed from the adhesive tape. Thereafter, in the second ultraviolet light applying step, the adhesive force of the adhesive tape in its second area corresponding to each device portion 15 of the package substrate 11 is reduced by applying ultraviolet light. Thereafter, in the device peeling step, the plural device packages 25 are peeled from the adhesive tape. Also in this case, the marginal portion 17 is removed from the adhesive tape in the dividing step as mentioned above, so that there is no possibility that the marginal portion 17 may be erroneously picked up in picking up the plural device packages 25 in the device peeling step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package substrate dividing method for dividing a package substrate into a plurality of device packages in a condition where an ultraviolet curing type adhesive tape is attached to a back side of said package substrate, by holding said package substrate through said adhesive tape on a chuck table and cutting said package substrate along a plurality of division lines formed on a front side of said package substrate, said package substrate including a device portion partitioned into a plurality of device package regions by said division lines and a marginal portion surrounding said device portion, said package substrate dividing method comprising:

- a first ultraviolet light applying step of applying ultraviolet light to said adhesive tape in a condition where a first area of said adhesive tape corresponding to said marginal portion is exposed and a second area of said adhesive tape corresponding to said device portion is masked by a mask member, thereby reducing an adhesive force of said adhesive tape in said first area corresponding to said marginal portion;
- a partial peeling step of partially peeling said adhesive tape from said package substrate in said first area corresponding to said marginal portion after performing said first ultraviolet light applying step; and
- a dividing step of cutting said package substrate along each division line by using a cutting blade set at a height where said adhesive tape attached to the back side of said package substrate is cut by said cutting blade, thereby dividing said package substrate into said device packages after performing said partial peeling step;
- wherein in said dividing step, said marginal portion separated from said package substrate is scattered by a rotation of said cutting blade and thereby removed from said adhesive tape.

2. The package substrate dividing method according to claim 1, further comprising:

- a second ultraviolet light applying step of applying ultraviolet light to said adhesive tape in said second area corresponding to said device portion to thereby reduce an adhesive force of said adhesive tape in said second area corresponding to said device portion after performing said dividing step; and
- a device peeling step of peeling said device packages from said adhesive tape after performing said second ultraviolet light applying step.

* * * * *